United States Patent
Mino et al.

(10) Patent No.: US 8,481,367 B2
(45) Date of Patent: Jul. 9, 2013

(54) METHOD OF MANUFACTURING CIRCUIT DEVICE

(75) Inventors: Katsuyoshi Mino, Ota (JP); Akira Iwabuchi, Chiba (JP); Ko Nishimura, Gunma (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 83 days.

(21) Appl. No.: 13/189,155

(22) Filed: Jul. 22, 2011

(65) Prior Publication Data

US 2012/0021568 A1   Jan. 26, 2012

(30) Foreign Application Priority Data

Jul. 22, 2010   (JP) ................................ 2010-164998

(51) Int. Cl.
*H01L 25/00* (2006.01)

(52) U.S. Cl.
USPC .... 438/109; 438/112; 438/116; 257/E21.499; 257/E21.509; 257/E23.033; 257/E23.174; 257/E23.194

(58) Field of Classification Search
USPC ........... 438/109–127; 257/E21.499–E21.502, 257/509, 23.033, 116, 174, 194, 324
See application file for complete search history.

(56) References Cited

U.S. PATENT DOCUMENTS

| | | | |
|---|---|---|---|
| 4,640,583 A * | 2/1987 | Hoshikawa et al. | 349/153 |
| 7,807,510 B2 * | 10/2010 | Kobayashi | 438/124 |
| 8,084,301 B2 * | 12/2011 | Mino et al. | 438/126 |
| 2005/0067719 A1 | 3/2005 | Hayashi et al. | |
| 2005/0161782 A1 | 7/2005 | Kanakubo | |
| 2006/0220189 A1 * | 10/2006 | Sakamoto et al. | 257/666 |
| 2008/0293189 A1 * | 11/2008 | Kobayashi | 438/121 |
| 2009/0091048 A1 * | 4/2009 | Kawakubo | 264/1.32 |
| 2009/0230487 A1 * | 9/2009 | Saitoh et al. | 257/419 |
| 2010/0065960 A1 * | 3/2010 | Mino et al. | 257/693 |
| 2010/0148362 A1 * | 6/2010 | Sakurai | 257/737 |
| 2010/0184256 A1 * | 7/2010 | Chino | 438/118 |
| 2011/0287582 A1 * | 11/2011 | Shimada et al. | 438/107 |
| 2012/0013021 A1 * | 1/2012 | Kobayashi et al. | 257/774 |
| 2012/0049222 A1 * | 3/2012 | Yoshizumi et al. | 257/98 |

FOREIGN PATENT DOCUMENTS

| | | |
|---|---|---|
| JP | 11-340257 | 12/1999 |
| JP | 2010-86993 | 4/2010 |
| KR | 10-2005-0065328 | 6/2005 |
| KR | 10-2007-0104497 | 10/2007 |

OTHER PUBLICATIONS

Office Action dated Sep. 18, 2012, directed to Korean Application No. 10-2011-0072502; 3 pages.

* cited by examiner

*Primary Examiner* — Michael Lebentritt
(74) *Attorney, Agent, or Firm* — Morrison & Foerster LLP

(57) ABSTRACT

Provided is a method of manufacturing a circuit device in which a circuit element is resin-sealed with sealing resins formed integrally with each other. In the present invention, a resin sheet and a circuit board are housed in a cavity of a mold, and thereafter a first sealing resin formed of a tablet in melted form is injected into the cavity. At the time of injecting the first sealing resin, a second sealing resin formed of the resin sheet in melted form is not yet cured and is maintained in liquid form. Accordingly, the injected first sealing resin and the second sealing resin are mixed at the boundary therebetween, preventing the generation of a gap in the boundary portion and therefore preventing the deterioration of the moisture resistance and withstand voltage at the boundary portion.

5 Claims, 11 Drawing Sheets

METHOD OF MANUFACTURING CIRCUIT DEVICE

This application claims priority from Japanese Patent Application Number JP 2010-164998 filed on Jul. 22, 2010, the content of which is incorporated herein by reference in its entirety.

BACKGROUND OF THE INVENTION

1. Field of the Invention

The present invention relates to a method of manufacturing a circuit device in which a circuit element is resin-sealed.

2. Description of the Related Art

As methods of resin-sealing a circuit element such as a semiconductor element, there are a method in which the circuit element is housed inside a casing member and a method in which the circuit element is resin-sealed with a sealing resin such as an epoxy resin. In recent years, the sealing method employing a resin sealing has been frequently used in view of productivity and the like.

In a process of resin-sealing a circuit element, the circuit element and the like are housed within a cavity of a mold, and a sealing resin in liquid form is then injected into the cavity to thereby resin-seal the circuit element. This technology is described for instance in Japanese Patent Application Publication No. Hei 11-340257.

This resin-sealing process is described with reference to FIGS. 11A and 11B. FIG. 11A is a cross-sectional view showing the resin-sealing process, and FIG. 11B is a cross-sectional view showing a configuration of a circuit device 200 as manufactured.

Referring to FIG. 11A, an island 202 having a semiconductor element 204 fixed on the top surface thereof is housed within a cavity 214 formed by bringing an upper mold half 224 and a lower mold half 226 into contact with each other. Also, a pod 220 that communicates with the cavity 214 via a runner 218 is formed in the lower mold half 226, and a tablet 228 is housed in the pod 220. The tablet 228 is formed by pressure-molding a granular thermosetting resin and has a columnar shape.

The above-mentioned mold has been heated, and thus, the tablet 228 housed in the pod 220 is gradually melted into a sealing resin in liquid form. Then, the sealing resin in liquid form pressurized by a plunger 222 is fed to the cavity 214 via the runner 218 and a gate 216, so that the semiconductor element 204 and the island 202 are sealed by the sealing resin. Also, along with injection of the sealing resin, air in the cavity 214 is released to the outside through an air vent 244.

The manufactured circuit device 200 is shown in FIG. 11B. The island 202, the semiconductor element 204, fine metal wires 206 and leads 210 are resin-sealed with a sealing resin 208. Also, the back surface of the island 202 is wholly covered with the sealing resin 208 in order to secure withstand voltage and moisture resistance.

With the sealing method described above, however, the bottom surface of the island 202 cannot be covered in some cases. Specifically, referring to FIG. 11B, the sealing resin 208 covering the bottom surface of the island 202 is desirably thin so that heat produced by the semiconductor element 204 can be well dissipated to the outside via the island 202 and the sealing resin 208. The heat dissipation performance of the whole device improves when the thickness of the sealing resin 208 covering the bottom surface of the island 202 is of the order of 0.5 mm or below, for example. Now, refer back to FIG. 11A. In order to achieve such a thickness, the gap between the bottom surface of the island 202 and an inner wall of the lower mold half 226 needs to be set narrow in the resin-sealing process, but there is a possibility that the sealing resin cannot be fully filled in the gap. If there is a region with no sealing resin filled in it, this region will be a void, causing a defect.

A sealing method for avoiding such a problem is described in Japanese Patent Application Publication No. 2010-86993. Referring to FIG. 3 and a part explaining it in Japanese Patent Application Publication No. 2010-86993, a resin sheet 52 disposed on the bottom surface of a circuit board 22 is melted to achieve thin resin sealing on the bottom surface of the circuit board 22.

Specifically, first, the resin sheet 52 formed by compressing a resin material is disposed on a lower mold half 44, and the circuit board 22 is placed on the top surface of the resin sheet 52. The resin sheet 52 is then heated and melted by the lower mold half 44, thereby thinly covering the bottom surface of the circuit board 22.

By covering the bottom surface of the circuit board 22 with the resin sheet 52 in this manner, the bottom surface of the circuit board 22 can be thinly resin-sealed without generating a void.

In the resin-sealing method described in Japanese Patent Application Publication No. 2010-86993, the resin sealing is performed using: the resin sheet 52 prepared underneath the bottom surface of the circuit board 22; and a molding resin injected into the cavity in which the circuit board 22 is disposed.

Here, even when the resin sheet and the molding resin are made of the same material, a gap may be formed in the interface of the two resins if they are thermally cured at different timings. This causes a problem of deteriorating the withstand voltage and moisture resistance at the interface.

Specifically, since the resin sheet is in surface contact with the mold, heat is easily transmitted from the mold to the resin sheet, and therefore the melting and thermal curing thereof occur in an early stage of the sealing. Then, by the time the molding resin in liquid form is injected into the cavity, the resin sheet has already been thermally cured and lost its flowability so that the resin materials of these may not be mixed together at the boundary therebetween. Such a situation may lead to the generation of a gap in the boundary between the molten resin sheet and the injected molding resin.

The present invention has been made in view of the problem described above, and an object thereof is to provide a method of manufacturing a circuit device in which a circuit element can be resin-sealed with sealing resins formed integrally with each other.

SUMMARY OF THE INVENTION

A method of manufacturing a circuit device according to the present invention includes the steps of: disposing a circuit element and a compressed sheet within a cavity of a mold and loading a resin tablet into a pod of the mold; and resin-sealing the circuit element by injecting a first sealing resin formed of the resin tablet in melted form and by melting the compressed sheet into a second sealing resin, wherein in the resin-sealing step, the second sealing resin formed of the molten compressed sheet is caused to cure after the injection of the first sealing resin into the cavity.

BRIEF DESCRIPTION OF THE DRAWINGS

FIG. 10A is a view showing the whole AC outdoor unit, and FIG. 10B is a view showing a part where the manufactured circuit device is installed.

FIG. 11A is a cross-sectional view showing a resin-sealing process, and FIG. 11B is a cross-sectional view showing a circuit device as manufactured.

DESCRIPTION OF THE INVENTIONS

First Embodiment

Figure 1A:
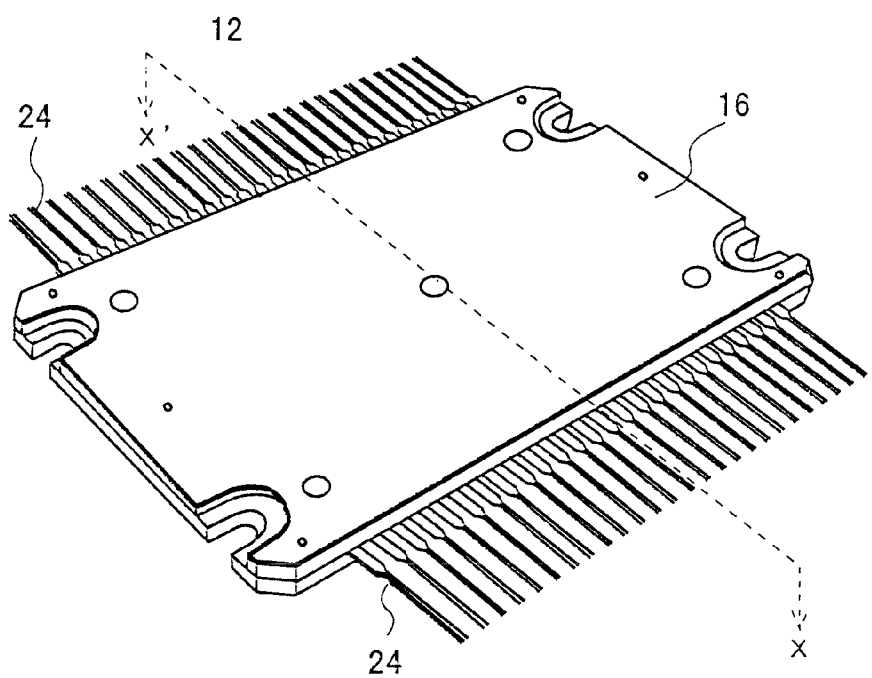
FIGS. 1A and 1B are a perspective view and a cross-sectional view, respectively, showing a hybrid integrated circuit device as manufactured by a circuit device manufacturing method according to a preferred embodiment of the present invention.
Figure 1B:
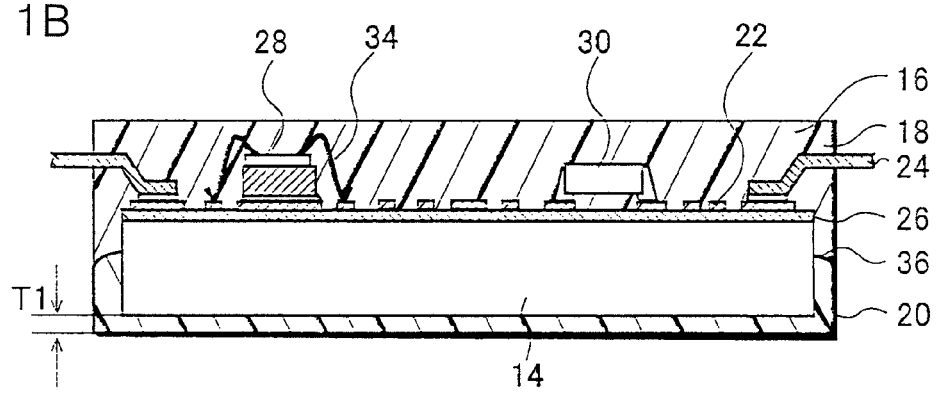

Description will be given with reference to FIGS. 1A and 1B with regard to a configuration of a hybrid integrated circuit device 12 to which a first embodiment is applied. FIG. 1A is a perspective view of the hybrid integrated circuit device 12, and FIG. 1B is a cross-sectional view taken along the line X-X' of FIG. 1A.

In the hybrid integrated circuit device 12, a hybrid integrated circuit formed of a conductive pattern 22 and circuit elements is mounted on the top surface of a circuit board 14, and a lead 24 electrically connected to the circuit is led out to the outside. Further, the hybrid integrated circuit constructed on the top surface of the circuit board 14, and the top, side and bottom surfaces of the circuit board 14 are integrally covered with a sealing resin 16 made of a thermosetting resin.

The circuit board 14 is the board made of metal such as aluminum or copper. The specific size thereof is, for example, approximately 61 mm in length, 42 mm in width, and 1 mm in thickness. Here, a material other than metal may be used as the material for the circuit board 14, and for example, a ceramic or resin material may be used as the material for the circuit board 14.

An insulating layer 26 made of an epoxy resin highly filled with a filler is formed so as to cover the entire front surface of the circuit board 14.

The conductive pattern 22 is formed of a metal film made of copper or the like and having a thickness on the order of 50 µm, and is formed on the front surface of the insulating layer 26 so as to implement a predetermined electric circuit. Also, a pad formed of the conductive pattern 22 is formed at or around a location where the lead 24 is led out.

A semiconductor element 28 and a chip element 30 (circuit elements) are fixed to the conductive pattern 20 in predetermined locations through a bonding material such as solder. A transistor, an LSI chip, a diode or the like is used as the semiconductor element 28. Here, the semiconductor element 28 and the conductive pattern 22 are connected together by a fine metal wire 34. A chip resistor, a chip capacitor or the like is used as the chip element 30. Electrodes on both ends of the chip element 30 are fixed to the conductive pattern 22 through a bonding material such as solder.

The lead 24 is fixed to the pad provided on the periphery of the circuit board 14, and functions as an external connection terminal to let an input or output signal pass through. Referring to FIG. 1B, many leads 24 are provided along two opposite sides of the circuit board 14.

The sealing resin 16 is formed by transfer molding using the thermosetting resin. In FIG. 1B, the sealing resin 16 seals the conductive pattern 22, the semiconductor element 28, the chip element 30 and the fine metal wire 34. Then, the top, side and bottom surfaces of the circuit board 14 are covered with the sealing resin 16.

Further description will be given with reference to FIG. 1B with regard to the sealing resin 16. The sealing resin 16 is formed of a first sealing resin 18 and a second sealing resin 20. In the drawing, a boundary 36 between the first sealing resin 18 and the second sealing resin 20 is depicted; however, the first and second sealing resins 18 and 20 are integrally formed in the actual hybrid integrated circuit device 12. That is, the boundary 36 between the first and second sealing resins 18 and 20 is hardly visible with the naked eyes.

The first sealing resin 18 is formed by injecting a resin in liquid form into a cavity of a mold. Here, the first sealing resin 18 covers the circuit elements such as the semiconductor element 28, the connecting portions of the leads 24, the top surface of the circuit board 14 and upper portions of the side surfaces thereof.

The second sealing resin 20 is formed by melting a resin sheet (compressed sheet) disposed on the bottom surface of the circuit board 14. The second sealing resin 20 covers lower portions of the side surfaces of the circuit board 14 and the bottom surface thereof. A thickness T1 of the second sealing resin 20 covering the bottom surface of the circuit board 14 lies between 0.1 mm and 0.3 mm, both inclusive, for example, which is very thin. The thin second sealing resin 20 is small in thermal resistance, and thus, heat dissipated from the circuit elements such as the semiconductor element 28 is well dissipated to the outside via the circuit board 14 and the second sealing resin 20.

Each of the first and second sealing resins 18 and 20 mentioned above is a mixture of a resin material such as an epoxy resin, a filler, a cure accelerator and the like. Here, the first and second sealing resin 18 and 20 may be made of the same material or of different materials.

The amount of filler contained in the second sealing resin 20 may be set larger than the amount of filler contained in the first sealing resin 18. When the second sealing resin 20 contains a large amount of filler, the thermal resistance of the second sealing resin 20 becomes low. Accordingly, heat produced upon the operations of the circuit elements such as the semiconductor element 28 is well dissipated to the outside via the circuit board 14 and the second sealing resin 20. On the other hand, when the amount of filler contained in the first sealing resin 14 is reduced, the filler, which is hard, collides less frequently with the circuit elements and the fine metal wire 34 at the time of injecting the resin. Accordingly, the damage on the circuit elements caused in the resin-sealing process can be reduced.

In addition, the type of filler contained in the first sealing resin 18 may be different from the type of filler contained in the second sealing resin 20. For example, alumina ($Al_2O_3$) may be used as the filler contained in the second sealing resin 20, and silica ($SiO_2$) may be used as the filler contained in the first sealing resin 18. The heat dissipation via the second sealing resin 20 is enhanced by using an alumina excellent in thermal conductivity as the filler contained in the second sealing resin 20. Further, moisture intrusion from the outside through the first sealing resin 18 is prevented by using a silica excellent in moisture resistance as the filler contained in the first sealing resin 18. The circuit elements sealed with the first sealing resin 18 are therefore prevented from being subjected to short circuit.

Further more, the shapes of the fillers contained in both resins may be different from each other. Specifically, a filler having a spherical shape may be filled in the first sealing resin 18 while a filler having a fractured shape may be filled in the second sealing resin 20. Giving a spherical shape to the filler contained in the first sealing resin 18 will reduce the damage on the circuit elements attributable the contact of the filler contained in the first sealing resin 18 with the circuit elements during an injection molding process. Further, giving a fractured shape to the filler contained in the second sealing resin 20 will increase the contact area between the filler's surface and the resin component, whereby thermal conduction via the filler is improved.

Additionally, the amount of cure accelerator contained in the resin material making up the second sealing resin 20 may be set smaller than the amount of cure accelerator contained in the resin material making up the first sealing resin 18. Doing so will lengthen a cure time required to cure the second sealing resin 20, which in turn allows the first and second sealing resins 18 and 20 to be mixed at the boundary therebetween in the resin sealing process. As a result, the deterioration of the withstand voltage and moisture resistance at the interface of the two resins is prevented. This matter will be described later with reference to FIG. 5.

Here, the boundary between the first and second sealing resins 18 and 20 is located at a position where they cover the side surfaces of the circuit board 14. The boundary portion between the first and second sealing resins 18 and 20 is somewhat inferior to the other portions of the sealing resin 16 in terms of withstand voltage and moisture resistance. For this reason, if the boundary portion is disposed on the bottom surface of the circuit board 14 and the bottom surface of the sealing resin 16 is brought into tight contact with a heat sink, short circuit may possibly occur between the circuit board 14 and the heat sink through the boundary portion. In contrast, the side surfaces of the circuit board 14 are less likely to be in contact with external components, and therefore short circuit is unlikely.

Description will be given with reference to FIGS. 2A to 5 with regard to a method of manufacturing the hybrid integrated circuit device 12 having the aforementioned configuration.

Figure 2A:
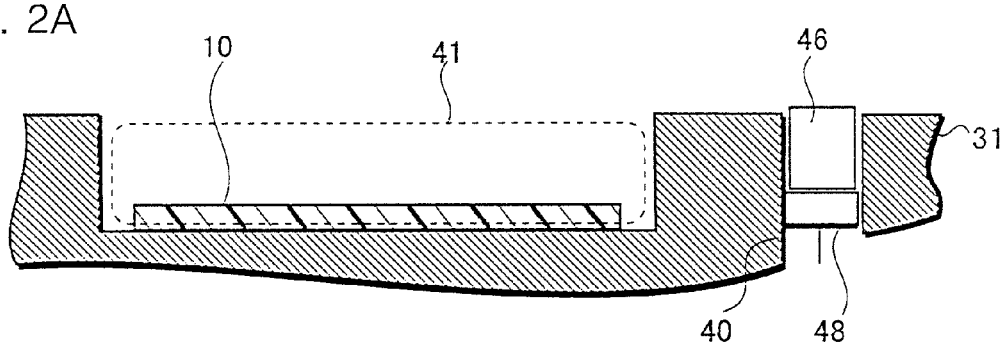
FIGS. 2A, 2B and 2C are cross-sectional views showing the circuit device manufacturing method according to the preferred embodiment of the present invention.
Figure 2B:
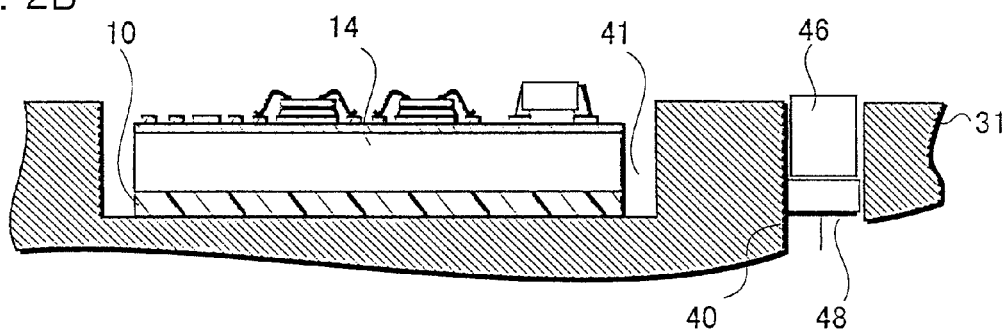
Figure 2C:
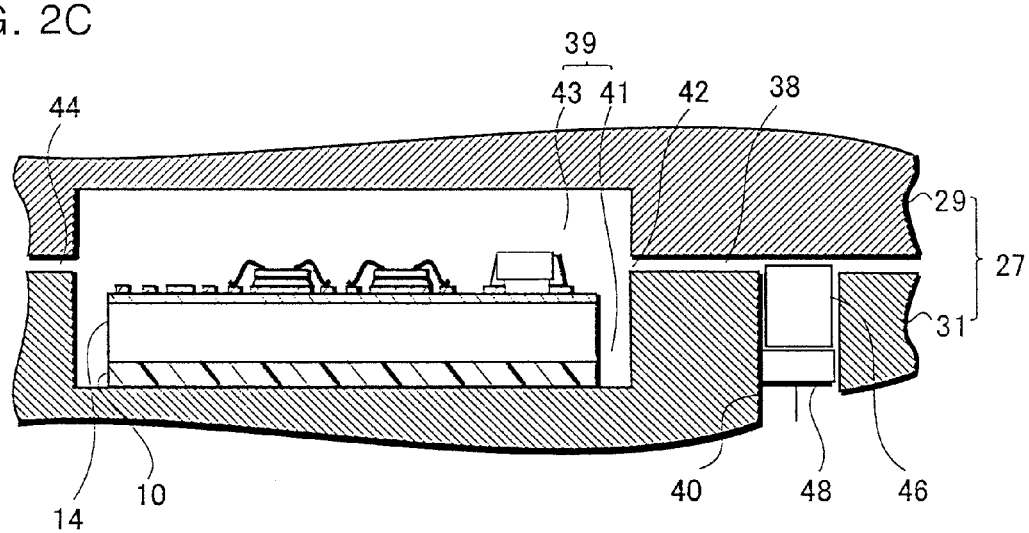

Referring to FIGS. 2A to 2C, first, a tablet 46, a resin sheet 10 and a circuit board 14 are housed into a mold within which resin sealing is to be performed.

Referring to FIG. 2A, a lower mold half 31 is a part of the mold, and is where a recessed first sealing region 41—a part of a cavity—and a pod 40 are formed. The pod 40 is a cylindrical region to house the tablet 46 which will serve as a sealing resin material injected into the cavity. A plunger 48 for pressing the tablet 46 is provided in the pod 40.

The resin sheet 10 and the tablet 46 are loaded into the lower mold half 31 having the above structure.

The resin sheet 10 is formed by compressing a powdered resin in granular form having a thermosetting resin as the main ingredient and assumes the form of a sheet. The resin sheet 10 will serve as a part of the sealing resin that seals the circuit elements. Specifically, the resin sheet 10 will be the second sealing resin 20 shown in FIG. 1B.

The thickness of the resin sheet 10 lies between 0.1 mm and 0.6 mm, both inclusive, for example. By setting the thickness of the resin sheet 10 not larger than 0.6 mm, the back surface of the circuit board 14 can be resin-sealed with a thin second sealing resin 20 formed of the molten resin sheet 10. On the other hand, by setting the thickness of the resin sheet 10 not smaller than 0.1 mm, the stiffness of the resin sheet 10 is secured to or above a certain level, hence preventing cracking and the like of the resin sheet 10 during a transporting phase.

Further, the resin sheet 10 is made of a powdered resin in the form of many granules. The powdered resin is made of a thermosetting resin such as an epoxy resin having an additive such as a filler added thereto, and the particle size of the powdered resin is equal to or less than 1.0 mm, for example.

Furthermore, the percentage of the powdered resin filled in the resin sheet 10 (i.e., the percentage of the powdered resin relative to the total volume of the resin sheet 10) is equal to or more than 99%. The percentage of the powdered resin filled in the resin sheet 10 according to this embodiment is very high, taking it into account that the percentage of a powdered resin filled in a resin tablet for use in general resin sealing is of the order of 95%. The percentage of the powdered resin filled in the resin sheet 10 is set high as mentioned above to prevent the formation of a void in the sealing resin formed by melting the resin sheet 10.

The tablet 46 is a sealing resin material to be injected into the cavity to resin-seal the circuit elements, and will serve as the first sealing resin 18 shown in FIG. 1B. Like the resin sheet, the tablet 46 is formed by compressing a powdered resin.

The tablet 46 and the resin sheet 10 are each made of a resin material such as an epoxy resin having a filler added thereto, but these materials are different from each other as mentioned above. Specifically, the tablet 46 and the resin sheet 10 are different from each other in the amount, type and shape of the added filler. They are also different from each other in the amount of the cure accelerator to be mixed therein. The two materials are different in this way due to the differences between the first sealing resin 18 formed of the tablet 46 and the second sealing resin 20 formed of the resin sheet 10 as described with reference to FIGS. 1A and 1B.

Here, the resin sheet 10 and the table 46 may be loaded in the lower mold half 31 together at the same timing or one after the other with a slight delay.

Further, when the resin sheet 10 and the table 46 are to be loaded, the lower mold half 31 is already heated to a temperature equal to or higher than the melting temperature of each of the resin sheet 10 and the tablet 46 (e.g., 170 degrees or higher). Hence, the resin sheet 10 and the tablet 36 will start melting as soon as they are fed into the lower mold half 31.

Here, the resin sheet 10 has its whole bottom surface in contact with the lower mold half 31 and therefore has a large contact area. In contrast, the contact area of the tablet 46 with the lower mold half 31 is small. Thus, if the resin sheet 10 and the tablet 46 are loaded in the lower mold half 31 at the same timing, the whole resin sheet 10 starts melting quickly whereas the tablet 46 melts relatively slowly.

This implies that the melting and the curing progress quicker for the resin sheet 10 than for the tablet 46, possibly generating a gap in the boundary portion between the first sealing resin formed of the tablet 46 and the second sealing resin formed of the resin sheet 10. In this embodiment, however, the amounts of the cure accelerator contained in the resin sheet 10 and the tablet 46 are adjusted to solve this problem. This matter will be described later with reference to a process chart in FIG. 5.

Referring to FIG. 2B, next, the circuit board 14 is placed on the top surface of the resin sheet 10. The structure of the circuit board 14 is as described with reference to FIG. 1; that is, the hybrid integrated circuit formed of the circuit elements connected by the conductive pattern is mounted on the top surface of the circuit board 14 made of metal such as aluminum. Here, the circuit board 14 and the resin sheet 10 have the same size in a plan view and are disposed overlapping each other. However, the resin sheet 10 may be larger or smaller than the circuit board 14.

Referring to FIG. 2C, next, an upper mold half 29 is brought into contact with the lower mold half 31. As a result, the cavity 39 is formed by the first sealing region 41 in the lower mold half 31 and a second sealing region 43 in the upper mold half 29. Meanwhile, the cavity 39 communicates with the pod 40 provided in the lower mold half 31 via a runner 38 and a gate 42. Moreover, the cavity 39 communicates with the outside via an air vent 44. Furthermore, plural cavities 39 are provided to a mold 27.

Description will be given next with reference to FIGS. 3A to 3C with regard to how the aforementioned resin sheet 10 melts.

Figure 3A:
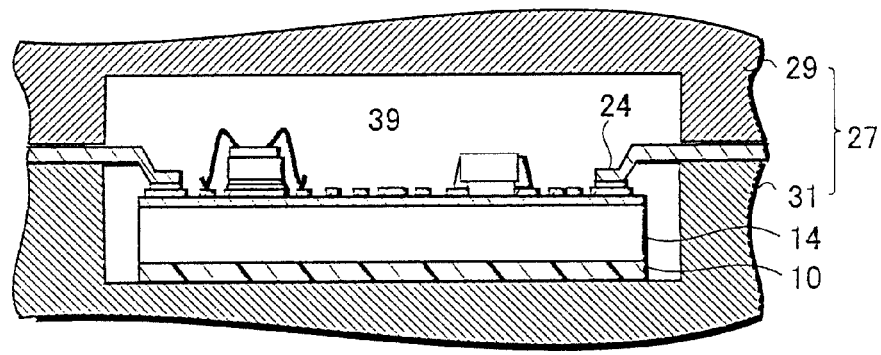
FIGS. 3A, 3B and 3C are enlarged cross-sectional views showing the circuit device manufacturing method according to the preferred embodiment of the present invention.

Referring to FIG. 3A, leads 24 are fixed to opposite end portions of the circuit board 14. The leads 24 are sandwiched between the upper and lower mold halves 29 and 31, thereby fixing the position of the circuit board 14 inside the cavity 39.

Figure 3B:
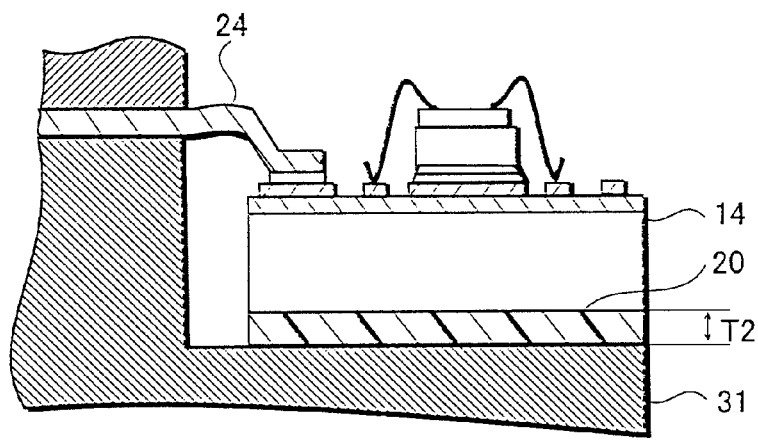

Referring to FIG. 3B, the resin sheet 10 in an early stage of this process is in a solid form that is obtained by compressing a granular thermosetting resin. Meanwhile, the lower mold half 31 is equipped with an unillustrated heater, by which the lower mold half 31 is heated to a temperature at which the resin sheet 10 can be melted and thermally cured (e.g., 170° C. or higher).

A thickness T2 of the resin sheet 10 is made greater than the thickness (T1 shown in FIG. 1B) of the sealing resin covering the bottom surface of the circuit board 14 in the hybrid integrated circuit device 12 to be manufactured. Specifically, if the thickness T1 of the sealing resin shown in FIG. 1B lies between 0.1 mm and 0.3 mm, both inclusive, the thickness T2 of the resin sheet 10 is set to lie between 0.4 mm and 0.6 mm, both inclusive.

As mentioned above, the position of the circuit board 14 in the cavity 39 is fixed by allowing the leads 24 to be sandwiched by the mold. Then, the shape and position of each lead 24 are set so that a distance between the bottom surface of the circuit board 14 and the bottom surface of the inner wall of the lower mold half 31 may be equal to T1 (see FIG. 1B).

Thus, when the resin sheet 10 and the circuit board 14 are placed on the lower mold half 31 in a way to overlap each other, and when the leads 24 are sandwiched by the mold 27, the leads 24 are elastically deformed, and as a result, the resin sheet 10 is pressed against and fixed to the lower mold half 31 by the bottom surface of the circuit board 14. FIG. 3B shows a state where the leads 24 are elastically deformed by being sandwiched by the mold.

Since the lower mold half 31 has been heated as mentioned above, the resin sheet 10 melts and softens with the passage of time, so that the bottom surface of the circuit board 14 is covered with the resin sheet 10 in liquid or semisolid form.

Figure 3C:
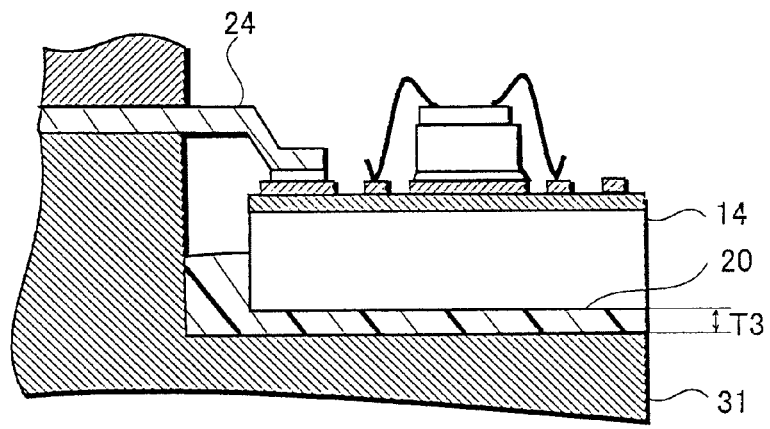

Referring to FIG. 3C, each lead 24 is sandwiched by the mold in an elastically deformed state as mentioned above, and thus, when the resin sheet 10 softens and loses the force supporting it, the shape of the lead 24 is restored to its original state, and the circuit board 14 sinks downward accordingly. As the circuit board 14 sinks, a portion of the softened resin sheet 10 moves from underneath the circuit board 14 to the sides thereof, and covers the side surfaces of the circuit board 14. In this manner, a thickness T3 of the resin sheet 10 covering the bottom surface of the sunk circuit board 14 lies between 0.1 mm and 0.3 mm, both inclusive, for example, which is equivalent to the thickness T1 of the sealing resin shown in FIG. 1B.

Figure 4A:
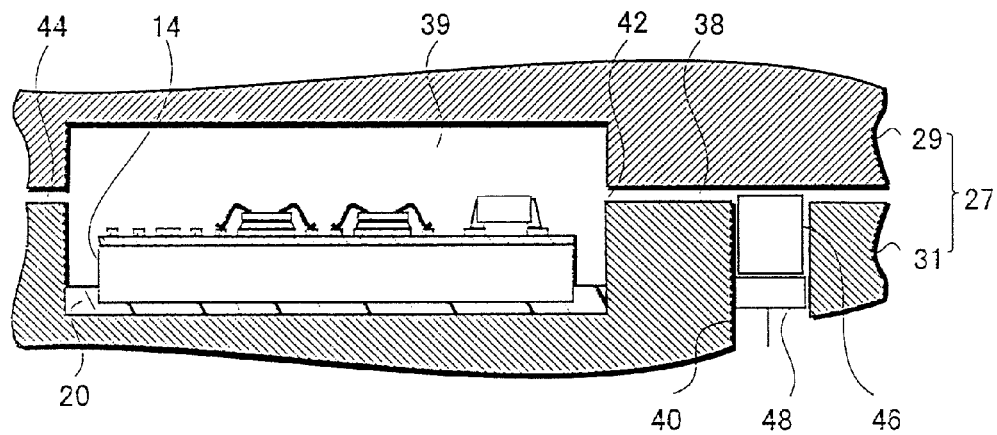
FIGS. 4A and 4B are cross-sectional views showing the circuit device manufacturing method according to the preferred embodiment of the present invention.

Referring to FIG. 4A, next, the sealing resin is injected into the cavity 39. Specifically, the tablet 46 loaded in the pod 40 provided in the lower mold half 31 is pressurized by the plunger 48. Consequently, the top surface of the tablet 46 is brought into contact with the upper mold half 29 which has been heated, so that the tablet 46 melts gradually from the top portion thereof. From this state, the plunger 48 is moved further upward to inject a first sealing resin 18 (see FIG. 4B) formed of the melted portion of the tablet 46 into the cavity 39. Specifically, the first sealing resin 18 having melted and turned into liquid or semisolid form flows through the runner 38 and passes the gate 42 and is then fed into the cavity 39. Meanwhile, as much air as the first sealing resin 18 injected into the cavity 39 is released to the outside via the air vent 44.

Figure 4B:
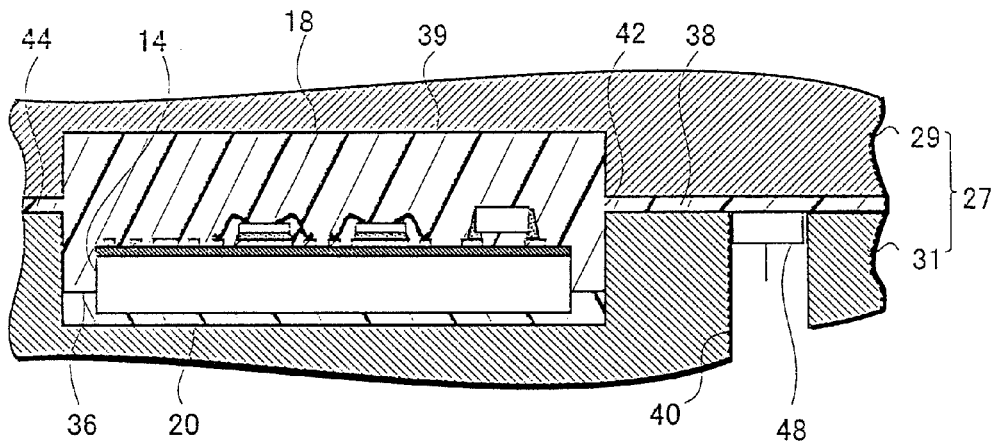

As mentioned above, the temperature of the mold 27 is higher than the temperature at which the first sealing resin 18 can be thermally cured. Thus, the first sealing resin 18 filled in the cavity 39 is polymerized and cured (gelled) with the passage of time. As shown in FIG. 4B, if the bottom surface of the circuit board 14 and lower portions of the side surfaces thereof are covered with the second sealing resin 20 form of the resin sheet 10, the top surface of the circuit board 14 and upper portions of the side surfaces thereof are covered with the first sealing resin 18.

Here, the second sealing resin 20 formed of the resin sheet 10 is not yet cured (gelled) but is maintained in liquid form when the first sealing resin 18 in liquid form is injected through the gate 42. Accordingly, the second sealing resin 20 formed of the resin sheet 10 and the first sealing resin 18 formed of the tablet 46 are mixed at the boundary therebetween. For this reason, although the boundary 36 between the first and second sealing resins 18 and 20 is depicted clearly in FIG. 4B, both resins are in fact in a mixed state at the boundary 36. This prevents the generation of a void in the boundary 36 and thereby prevents the situation where the moisture resistance and withstand voltage at the boundary 36 become lower than those in the other locations.

After the first sealing resin 18 is injected into the cavity 39, the first and second sealing resins 18 and 20 are cured (gelled) with the passage of time.

In this embodiment, the first and second sealing resins 18 and 20 may be cured simultaneously. In this manner, the resins around the boundary 36 are cured simultaneously with the resins of the other portions, and thereby stress produced as a result of the curing is prevented from being concentrated on the boundary 36. Accordingly, the deterioration of the moisture resistance and withstand voltage at the boundary portion 36 is prevented.

Alternatively, the second sealing resin 20 may be caused to cure earlier than the first sealing resin 18. In this manner, even if bending stress that bends the circuit board 14 into an arched shape is produced due to the cure shrinkage of the first sealing resin 18, the second sealing resin 20 cured earlier can reinforce the circuit board 14, hence preventing the warpage of the circuit board 14.

Once both the first and second sealing resins 18 and 20 are sufficiently polymerized and thermally cured by being heated in the mold 27, the upper and lower mold halves 29 and 31 are separated from each other, and the molded product—the hybrid integrated circuit device—is taken out. Thereafter, the sealing resin left filled in the air vent 44 and the runner 38 is separated from the main portion of the sealing resin 16.

By the process described above, the hybrid integrated circuit device 12 shown in FIGS. 1A and 1B is manufactured.

Figure 5:
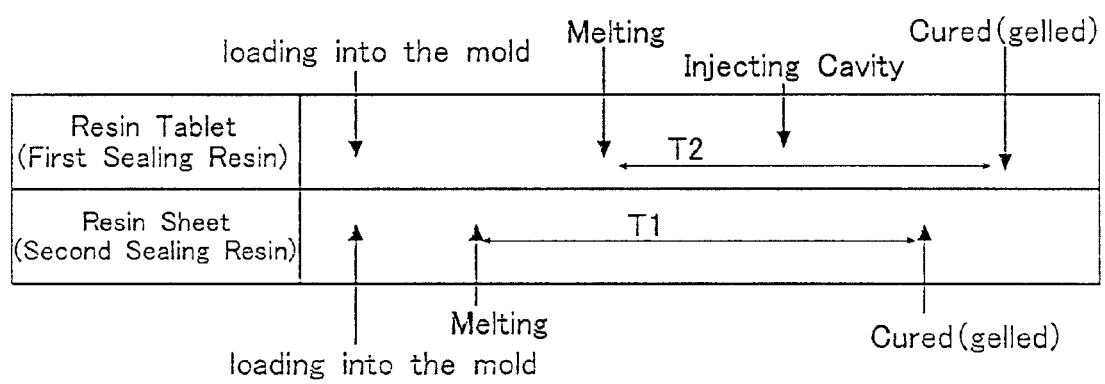
FIG. 5 is a chart showing the circuit device manufacturing method according to the preferred embodiment of the present invention and indicating times required for the melting and curing of a resin tablet and a resin sheet.

Description will be given with reference to the process chart in FIG. 5 with regard to the timings at which the resin tablet and the resin sheet are melted and cured in the resin-sealing process described above.

First, the resin tablet 46 and the resin sheet 10 are loaded in the mold at the substantially same timing (see FIG. 2A). At this point, the lower mold half 31 is already heated to or above the temperature at which the resin sheet 10 and the tablet 46 can be melted and cured.

As mentioned above, the resin sheet 10 has its whole bottom surface in contact with the lower mold half 31, and the contact area of the tablet 46 with the lower mold half 31 is smaller than that of the resin sheet 10. Accordingly, the resin sheet 10 starts melting earlier than the tablet 46 (see FIG. 2A).

Referring to FIG. 4B, the tablet 46 (first sealing resin 18) melted inside the pod 40 is then fed into the cavity 39. At this point, the second sealing resin 20 formed of the melted resin sheet 10 is not yet cured and is maintained in liquid form. Accordingly, the first sealing resin 18 formed of the tablet 46 and the second sealing resin 20 formed of the resin sheet 10 are mixed at the boundary 36 therebetween. This, as a result, prevents the deterioration of the moisture resistance and withstand voltage at the boundary 36.

The sealing resin formed of the resin tablet and the resin sheet is then heated by the mold and thermally cured. As mentioned above, the resin sheet may be caused to cure earlier than the resin tablet, or they may be caused to cure at the same timing.

In this embodiment, a cure time T1 required for the resin sheet to be cured after being melted is set longer than a cure time T2 for the resin tablet. For example, T1 and T2 are equal to 100 seconds and 70 seconds, respectively. To achieve such a time difference, the amount of the cure accelerator added to a resin material such as an epoxy resin making up the resin sheet (second sealing resin) is set smaller than the amount of the cure accelerator used in the resin tablet (first sealing resin).

In this manner, the second sealing resin 20 formed of the resin sheet 10 is maintained in liquid form when the first sealing resin 18 formed of the tablet 46 is injected in the cavity 39 as shown in FIG. 4B. Accordingly, the first sealing resin 18 formed of the resin tablet 46 and the second sealing resin 20 formed of the resin sheet 10 can be well mixed at the boundary 36 therebetween.

Second Embodiment

Figure 6A:
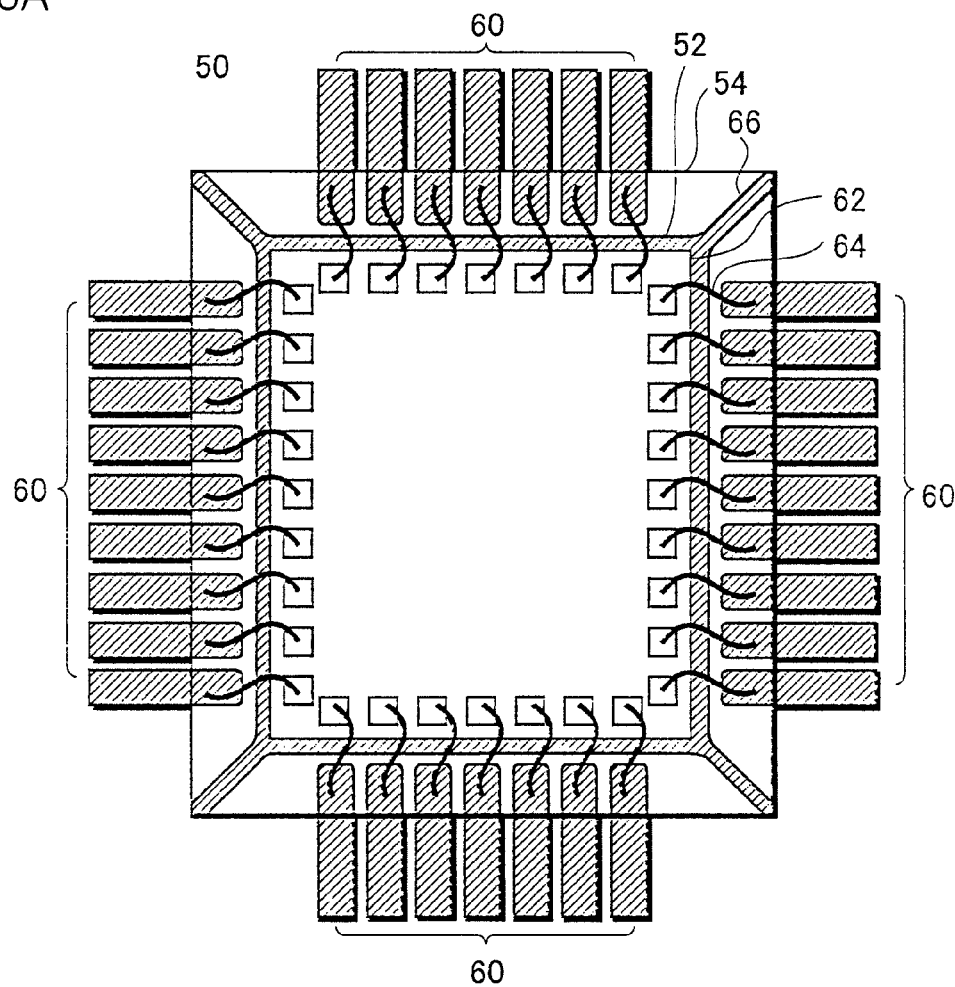
FIGS. 6A and 6B are a plan view and a cross-sectional view, respectively, showing a circuit device as manufactured by a circuit device manufacturing method according to a preferred embodiment of the present invention.
Figure 6B:
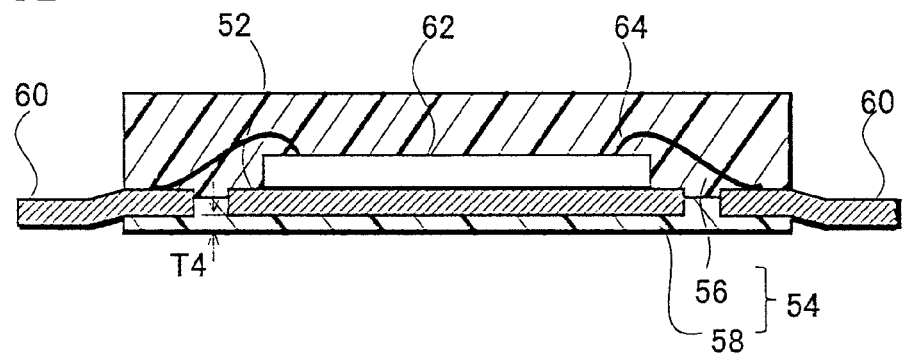

Description will be given with reference to FIGS. 6A and 6B with regard to a configuration of a circuit device 50 according to a second embodiment. FIGS. 6A and 6B are a plan view and a cross-sectional view of the circuit device 50, respectively. The circuit device and a manufacturing method thereof to be described in this embodiment are basically the same as those in the first embodiment described above. The difference is that the manufacturing method described above is applied to a circuit device 50 of a lead frame type.

The circuit device 50 includes: a semiconductor element 62; an island 52 having the semiconductor element 62 mounted thereon; a lead 60 connected to via a fine metal wire 64 to the semiconductor element 62; and a sealing resin 54 integrally resin-sealing these.

The semiconductor element 62 is an IC, an LSI or a discrete transistor having many electrodes formed on the top surface thereof, for example, and is fixed on the top surface of the island 52.

The island 52 is formed in a rectangular shape around the center of the circuit device 50, and is formed slightly larger than the semiconductor element 62 fixed on the top surface of the island 52. For example, if the size of the semiconductor element 62 fixed on the top surface of the island 52 is 10 mm×10 mm, the size of the island 52 is of the order of 12 mm×12 mm. Also, the back surface of the island 52 is thinly covered with the sealing resin 54. Further, there are suspension leads 66 extending outwardly from the four corners of the island 52, respectively.

The lead 60 is connected via the fine metal wire 64 to an electrode of the semiconductor element 62, and is exposed at one end to the outside from the sealing resin 54. Here, many leads 60 are arranged in a way to surround the semiconductor element 62.

The sealing resin 54 is formed by transfer molding using a thermosetting resin. In FIG. 6B, the sealing resin 54 covers the semiconductor element 62, each fine metal wire 64, a portion of each lead 60 and the side and bottom surfaces of the island 52.

Referring to FIG. 6B, the sealing resin 54 is formed of a first sealing resin 56 and a second sealing resin 58. In the drawing, the boundary between the first and second sealing resins 56 and 58 is depicted; however, the first and second sealing resins 56 and 58 are integrally formed in the actual circuit device 50. A thickness T4 of the second sealing resin 58 covering the bottom surface of the island 52 lies between 0.1 mm and 0.3 mm, both inclusive, for example, which is very thin.

In this embodiment too, the boundary between the first and second sealing resins 56 and 58 is situated on the lateral sides of the island 52, hence bringing about the advantage that the withstand voltage is secured there.

Description will be given with reference to FIGS. 7A to 9B with regard to the method of manufacturing the circuit device having the aforementioned configuration. The circuit device manufacturing method in this embodiment is basically the same as that in the first embodiment described above, and only differs in that the method is for manufacturing a circuit device of a lead frame type.

Figure 7A:
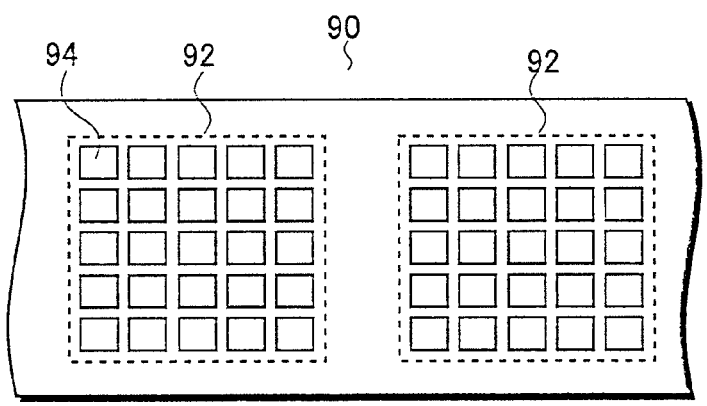
FIGS. 7A, 7B and 7C are a plan view, an enlarged plan view and a cross-sectional view, respectively, showing the circuit device manufacturing method according to the preferred embodiment of the present invention.
Figure 7B:
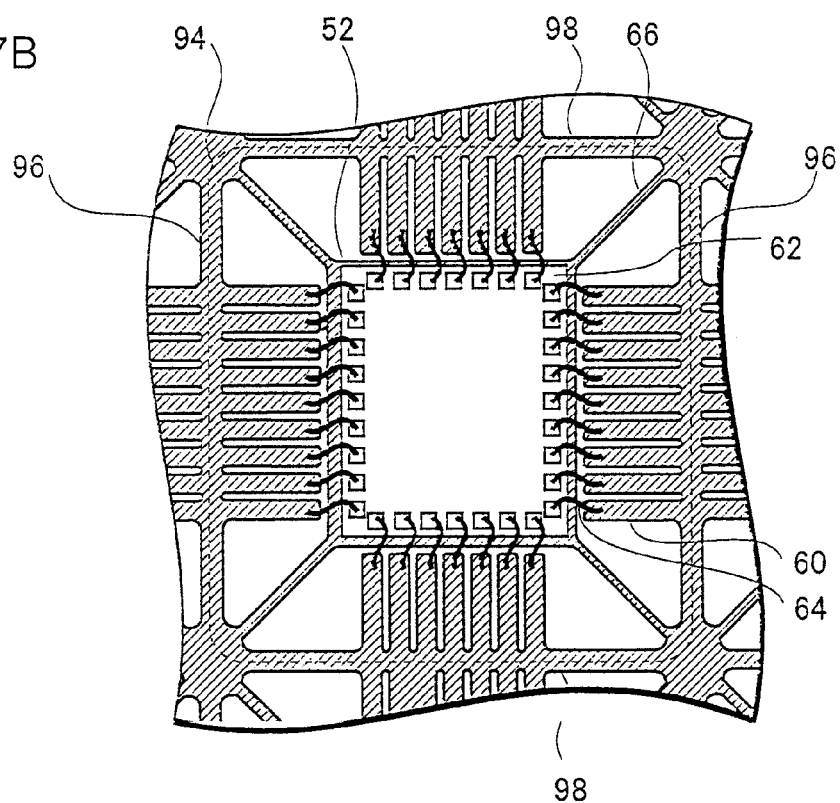
Figure 7C:
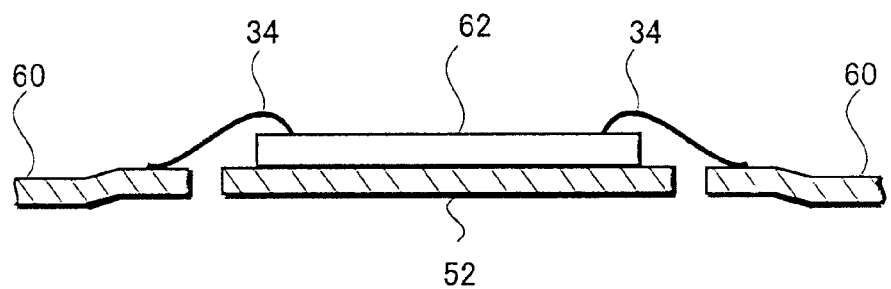

Referring to FIGS. 7A to 7C, first, a lead frame 90 of a predetermined shape is prepared, and each semiconductor element 62 is connected to a corresponding one of units 94 formed in the lead frame 90. FIG. 7A is a plan view showing the lead frame 90, FIG. 7B is a plan view showing the unit 94 contained in the lead frame 90, and FIG. 7C is a cross-sectional view of the unit 94.

Referring to FIG. 7A, the lead frame 90 is formed in the predetermined shape by etching or pressing a metal sheet made of metal such as copper and having a thickness on the order of 0.3 mm. In the lead frame 90, plural blocks 92 are arranged spaced apart from each other.

Referring to FIG. 7B, there are linkage portions 96 and 98 extending vertically and horizontally, respectively, in a grid pattern in each block 92. The unit 94 is formed in a region surrounded by the linkage portions 96 and 98. Specifically, there are leads 60 extending integrally from the linkage portions 96 and 98 toward the inside of the unit 94. In addition, an island 52 of a rectangular shape is formed around the center of the unit 94, and the four corners of the island 52 are continuous with the linkage portions 96 and 98 through suspension leads 66.

Referring to FIG. 7C, the semiconductor element 62 is fixed on the top surface of the island 52 contained in its corresponding unit 94. Electrodes provided on the top surface of the semiconductor element 62 are connected to the leads 60 via fine metal wires 64, respectively.

Figure 8A:
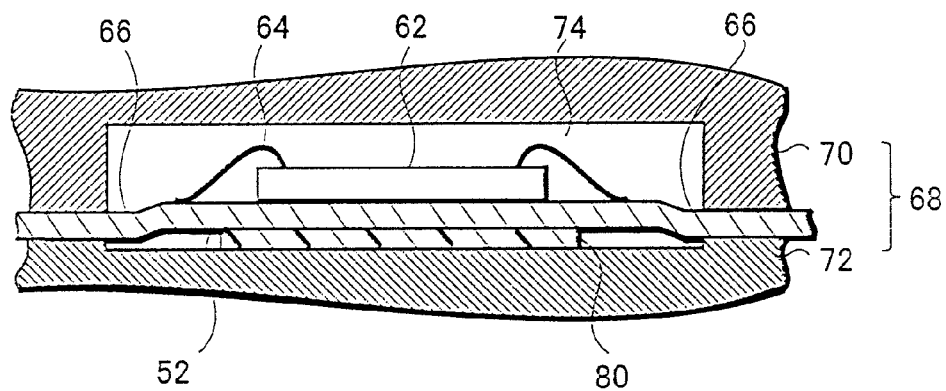
FIG. 8A and FIGS. 8B and 8C are a cross-sectional view and enlarged cross-sectional views, respectively, showing the circuit device manufacturing method according to the preferred embodiment of the present invention.
Figure 8B:
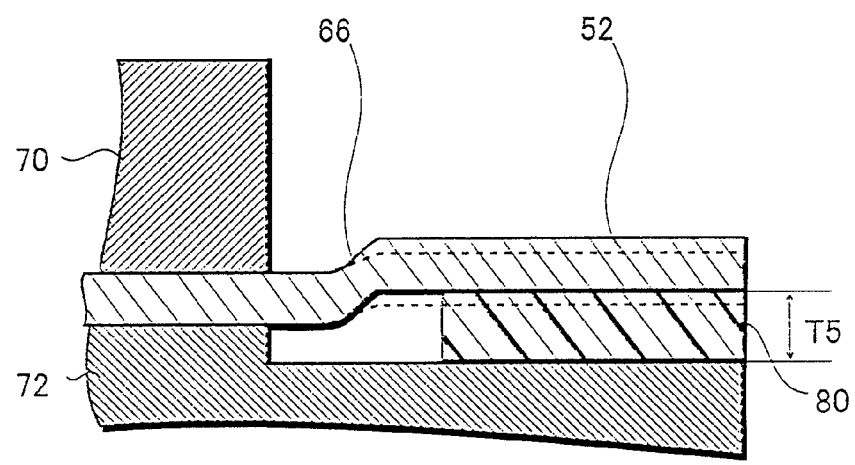
Figure 8C:
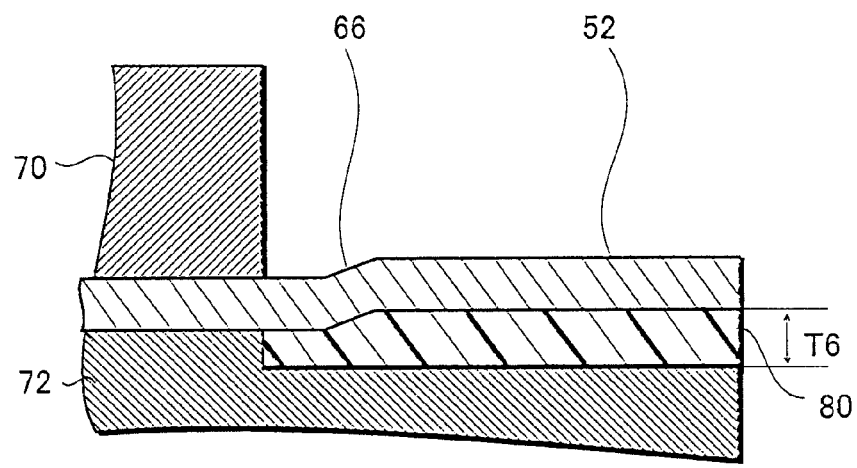

Referring to FIGS. 8A to 8C, next, the island 52 having the semiconductor element 62 fixed on the top surface thereof is housed into a cavity 74 of a mold 68.

Referring to FIG. 8A, here, a resin sheet 80 is placed on the bottom surface of the inner wall of a lower mold half 72, and subsequently, the island 52 is placed on the top surface of the resin sheet 80. Then, an upper mold half 70 and the lower mold half 72 are brought into contact with each other to thereby house the island 52 within the cavity 74. Also, the suspension leads 66 extending continuously from the island 52 are sandwiched and fixed between the upper and lower mold halves 70 and 72. With the suspension leads 66 sandwiched between the upper and lower mold halves as mentioned above, the vertical and horizontal positions of the island 52 in the cavity 74 are fixed. Incidentally, the resin sheet 80 in an early stage of this process is in solid form that is obtained by compressing a granular resin material. Also, the mold 68 is equipped with an unillustrated heater, by which the mold 62 is heated to a temperature at which the resin sheet 80 can be melted and thermally cured (e.g., 170° C. or higher).

Referring to FIG. 8B, a thickness T5 of the resin sheet 80 is made greater than the thickness (T4 shown in FIG. 6B) of the sealing resin covering the bottom surface of the island 52 in a circuit device 50 to be manufactured. Specifically, if the thickness T4 of the sealing resin shown in FIG. 6B lies between 0.1 mm and 0.3 mm, both inclusive, the thickness T5 of the resin sheet 80 is set to lie between 0.5 mm and 0.6 mm, both inclusive.

As mentioned above, the position of the island 52 in the cavity 74 is fixed by allowing the suspension leads 66 to be sandwiched by the mold. Then, the shape and position of each suspension lead 66 are set so that a distance between the bottom surface of the island 52 and the bottom surface of the inner wall of the lower mold half 72 may be equal to T4 (see FIG. 6B). Thus, when the resin sheet 80 and the island 52 are placed on the lower mold half 72 in a way to overlap each other, and when the suspension leads 66 are sandwiched by the mold 68, the suspension leads 66 are elastically deformed by the upper mold half 70 applying stress that presses and bends the suspension leads 66 in a direction from top to bottom. As a result, the resin sheet 80 is pressed against and fixed to the lower mold half 72 by the bottom surface of the island 52. FIG. 6B shows a state where the suspension leads 66 are elastically deformed by being sandwiched by the mold. Also, the shape of the undeformed suspension lead 186 is shown by the dotted lines.

Since the mold 68 has been heated as mentioned above, the resin sheet 80 melts and softens with the passage of time, so that the bottom surface of the circuit board 52 is covered with the resin sheet 80 in liquid or semisolid form.

Referring to FIG. 8C, each suspension lead 66 is sandwiched by the mold in an elastically deformed state as mentioned above, and thus, when the resin sheet 80 softens and loses the force supporting it, the shape of the suspension lead 66 is restored to its original state, and the island 52 sinks downward accordingly. As the island 52 sinks, a portion of the softened resin sheet 80 moves from underneath the island 52 to the sides thereof, and covers a portion around the bottom end of each side surface of the island 52.

As mentioned above, the thickness T6 of the resin sheet 80 covering the bottom surface of the sunk island 52 lies between 0.1 mm and 0.3 mm, both inclusive, for example, which is equivalent to the thickness T4 of the sealing resin shown in FIG. 6B. Meanwhile, the side surfaces of the island 52 are covered with the resin sheet 80 although such a state cannot be seen in the drawing as the suspension lead 66 stands in the way.

Figure 9A:
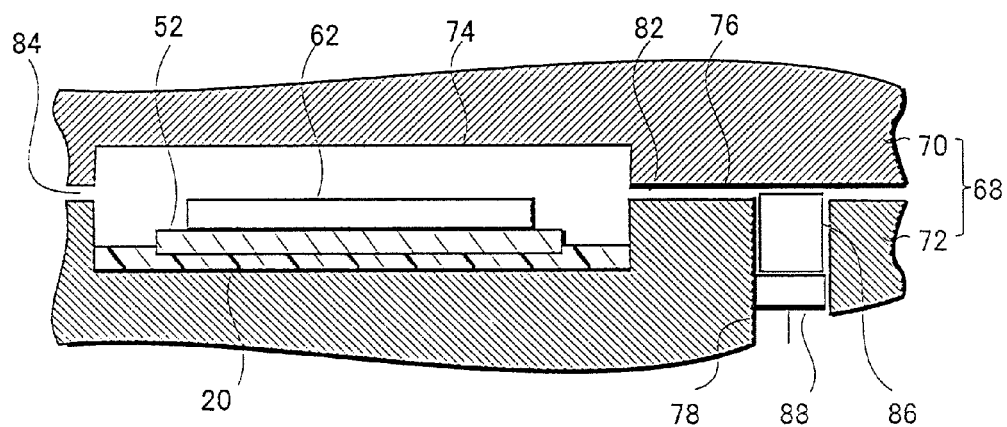
FIGS. 9A and 9B are cross-sectional views showing the circuit device manufacturing method according to the preferred embodiment of the present invention.

Referring to FIG. 9A, next, a sealing resin is injected into the cavity 36. Specifically, a tablet 86 is loaded into a pod 78 provided in the lower mold half 72 and is heated and melted therein. Subsequently, the tablet 86 is pressed by a plunger 88.

Since the mold has been heated to about 170° C. or higher as mentioned above, the tablet 86 gradually melts once loaded into the pod 78. So, when the tablet 86 is pressed by the plunger 88, the sealing resin having melted and turned into liquid or semisolid form flows through a runner 76 and passes a gate 82, and is then fed into the cavity 74. In the following description, the sealing resin fed through the gate 82 is called a first sealing resin 56, and the sealing resin formed of the molten resin sheet 80 is called a second sealing resin 58.

Figure 9B:
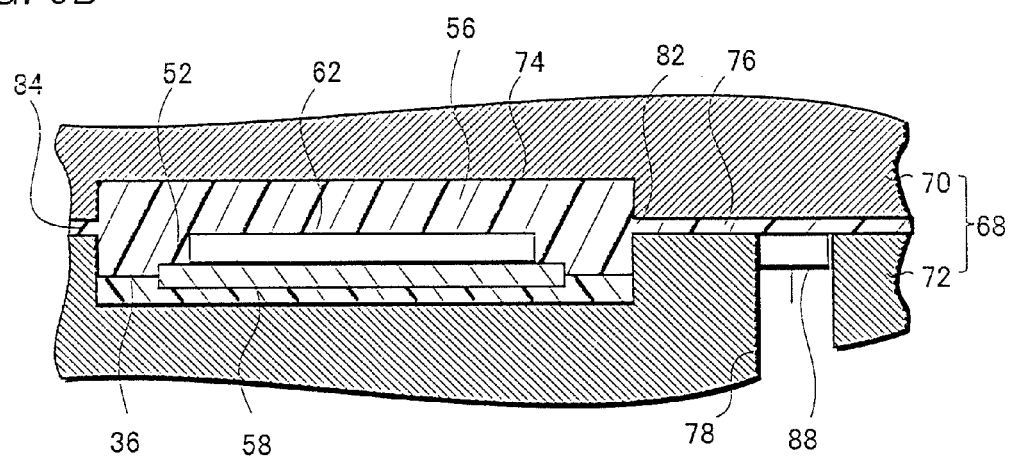

Referring to FIG. 9B, the injected first sealing resin 56 in liquid form is filled in the cavity 74. Here, the temperature of the mold 68 is higher than the temperature at which the first sealing resin 56 can be thermally cured. Thus, the first sealing resin 56 filled in the cavity 74 is polymerized and gelled (cured) with the passage of time.

Once both the first and second sealing resins 56 and 58 are sufficiently polymerized and thermally cured by being heated in the mold, the upper and lower mold halves 70 and 72 are separated from each other, and the molded product—the circuit device—is taken out.

The tablet 86 and the resin sheet 80 used in this embodiment are the same as those used in the first embodiment. Hence, the second sealing resin 58 formed of the molten resin sheet 80 is still in liquid form in the process of injecting the first sealing resin 56 formed of the molten tablet 86 into the cavity 74. Hence, the first and second sealing resins 56 and 58 are mixed at a boundary 36 therebetween. Accordingly, the deterioration of the moisture resistance and withstand voltage at the boundary portion is prevented.

Third Embodiment

Figure 10A:
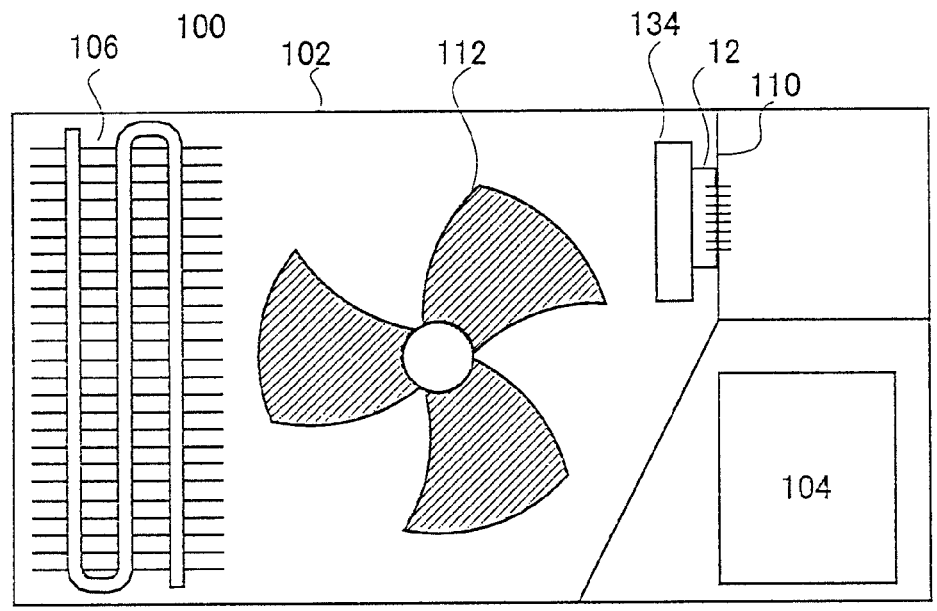
FIGS. 10A and 10B are views showing an AC outdoor unit in which the circuit device as manufactured by the circuit device manufacturing method according to the preferred embodiment of the present invention is installed.

Description will be given with reference to FIGS. 10A and 10B with regard to a configuration of an AC outdoor unit 100 in which a circuit device as manufactured by the above-described manufacturing method is installed. Here, the hybrid integrated circuit device 12 (see FIGS. 1A and 1B) described in the first embodiment is installed in the AC outdoor unit 100. Instead, the circuit device 50 (see FIGS. 6A and 6B) described in the second embodiment may be installed in the AC outdoor unit 100.

The AC outdoor unit 100 includes, inside a housing 102, a condenser 106, a fan 112, a compressor 104 and the hybrid integrated circuit device 12.

The compressor 104 compresses a refrigerant such as ammonia by using the driving force of a motor. The refrigerant compressed by the compressor 104 is delivered to the condenser 106. The fan 112 is blowing air at the condenser 106. Thus, the heat in the refrigerant inside the condenser 106 is dissipated to the outside. Further, the refrigerant is expanded and delivered to an evaporator situated inside the room and cools down the air in the room.

The hybrid integrated circuit device 12 here has a function to control the rotation of the motor that drives the compressor 104 or the fan 112, and is fixed to a mount board 110 provided inside the AC outdoor unit 100.

Figure 10B:
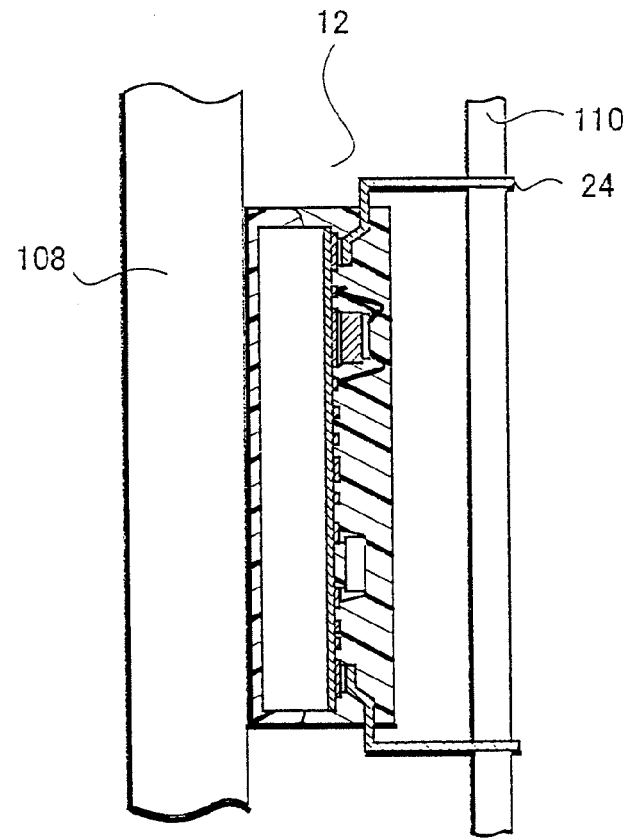
Figure 11A:
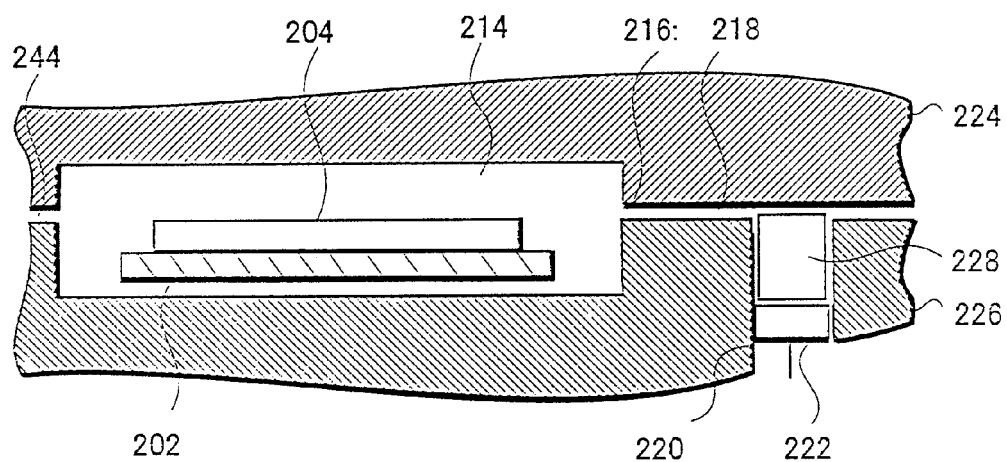
FIGS. 11A and 11B are views showing a circuit device manufacturing method according to a conventional technique.
Figure 11B:
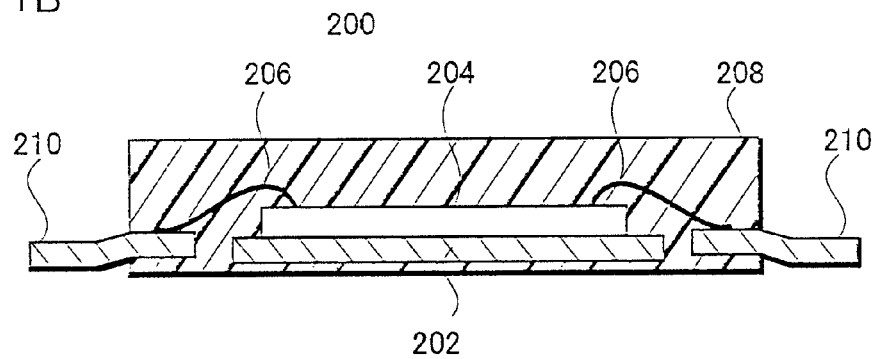

FIG. 10B shows a structure for the attachment of the hybrid integrated circuit device 12. Here, the leads 24 are mounted by insertion on the mount board 110. Moreover, the back surface of the hybrid integrated circuit device 12 is in contact with a flat, smooth surface of a heat sink 108.

In this embodiment, the sealing resin covering the bottom surface of the hybrid integrated circuit device 12 is formed extremely thin with the help of the manufacturing method using the resin sheet. Accordingly, heat produced upon driving the circuit elements provided inside the hybrid integrated circuit device 12 is well transmitted to the heat sink 108 via the circuit board and the sealing resin, and then dissipated to the outside.

In the present invention, circuit elements are resin-sealed with a first sealing resin injected into a cavity and a second sealing resin formed of a resin sheet disposed in the cavity in advance. Then, in a resin sealing process, the second sealing resin formed of the resin sheet is caused to cure after the first sealing resin in liquid form is injected into the cavity.

In this manner, the second sealing resin formed of the resin sheet is maintained in liquid or semisolid form at the time of injecting the first sealing resin into the cavity, so that both resins are mixed at the boundary therebetween. Accordingly, no gap is formed in the boundary between the first and second resins, preventing moisture intrusion from the outside through the gap as well as short circuit between the circuit element(s) and an external component through the boundary.

What is claimed is:

1. A method of manufacturing a circuit device, comprising the steps of:
   placing a circuit element and a compressed sheet within a cavity of a mold and loading a resin tablet into a pod of the mold, the resin tablet comprising a first sealing resin and the compressed sheet comprising a second sealing resin; and
   resin-sealing the circuit element by injecting a melted first sealing resin of the resin tablet and by melting the second sealing resin of the compressed sheet,
   wherein in the resin-sealing step, the melted second sealing resin of the compressed sheet is caused to cure after the injection of the first sealing resin into the cavity, and
   an amount of a cure accelerator contained in the second sealing resin of the compressed sheet is smaller than an amount of a cure accelerator contained in the first sealing resin of the resin tablet.

2. The method of manufacturing a circuit device according to claim 1, wherein a cure time of the second sealing resin of the compressed sheet is longer than a cure time of the first sealing resin of the resin tablet.

3. The method of manufacturing a circuit device according to claim 1, wherein in the resin-sealing step, the second sealing resin is caused to cure earlier than the first sealing resin.

4. The method of manufacturing a circuit device according to claim 1, wherein in the step of placing the circuit element, a circuit board on which a hybrid integrated circuit including a plurality of the circuit elements is mounted is placed on a top surface of the compressed sheet, and
   in the resin-sealing step, the circuit elements, a top surface of the circuit board and an upper portion of each side surface of the circuit board are covered with the first sealing resin formed of the molten resin tablet, whereas a bottom surface of the circuit board and a lower portion of the side surface of the circuit board are covered with the second sealing resin formed of the molten compressed sheet.

5. The method of manufacturing a circuit device according to claim 1, wherein in the step of placing the circuit element, an island having a semiconductor element fixed on a top surface thereof is placed on a top surface of the compressed sheet, and
   in the resin-sealing step, the semiconductor element, a top surface of the island and an upper portion of each side surface of the island are covered with the first sealing resin formed of the molted resin tablet, whereas a bottom surface of the island and a lower portion of the side surface of the island are covered with the second sealing resin formed of the molten compressed sheet.

* * * * *